United States Patent [19]

Shiraishi et al.

[11] Patent Number: 4,996,657
[45] Date of Patent: Feb. 26, 1991

[54] STEERING ANGLE DETECTING SYSTEM FOR AUTOMOTIVE VEHICLES

[75] Inventors: Shuji Shiraishi; Takashi Nishihara; Hironobu Kiryu; Naoki Omomo, all of Wako, Japan

[73] Assignee: Honda Giken Kogyo K.K., Tokyo, Japan

[21] Appl. No.: 324,234

[22] Filed: Mar. 15, 1989

[30] Foreign Application Priority Data

Mar. 18, 1988 [JP] Japan ............................. 63-36116[U]
Mar. 18, 1988 [JP] Japan ............................. 63-36117[U]
Mar. 18, 1988 [JP] Japan ............................. 63-36118[U]

[51] Int. Cl.⁵ ...................... G06F 15/50; G06F 11/00
[52] U.S. Cl. .................................... 364/559; 340/465; 364/424.05
[58] Field of Search ...................... 364/424.05, 426.02, 364/556, 559, 579; 318/563, 565, 638, 639, 652; 340/465, 438, 671; 235/103, 103.5 R

[56] References Cited

U.S. PATENT DOCUMENTS

| | | | |
|---|---|---|---|
| 4,476,529 | 10/1984 | Nakamura et al. | 364/424.05 |
| 4,486,845 | 12/1984 | Duckworth | 364/559 |
| 4,621,327 | 11/1986 | Dolph et al. | 364/424.05 |
| 4,633,419 | 12/1986 | Niiho et al. | 364/559 |
| 4,794,536 | 12/1988 | Eto et al. | 364/559 |
| 4,796,208 | 1/1989 | Kumagai et al. | 364/559 |
| 4,797,827 | 1/1989 | Cockerham | 364/559 |
| 4,840,389 | 6/1989 | Kawabe et al. | 364/424.05 |
| 4,878,557 | 11/1989 | Shibahata et al. | 364/424.05 |

Primary Examiner—Kevin J. Teska
Attorney, Agent, or Firm—Arthur L. Lessler

[57] ABSTRACT

A steering angle detecting system for a vehicle includes a sensor responsive to rotation of a steering wheel for generating angular pulses corresponding in number to the steering angle of the steering wheel. Another sensor generates a reference pulse at a predetermined angle of the steering wheel. The angular pulses are counted by a counter. The steering angle detecting system is determined to be abnormal if the counted value of the counter is not within a predetermined value range when the reference pulse is generated. Further, the rate of change of the counted value by the counter is detected, and the steering angle detecting system is determined to be abnormal if the detected rate of change of the counted value is greater than a predetermined value. Further, the steering angle detecting system is determined to be abnormal if the detected rate of change of the counted value has continued to be smaller than a predetermined value for a predetermined time period or longer.

12 Claims, 5 Drawing Sheets

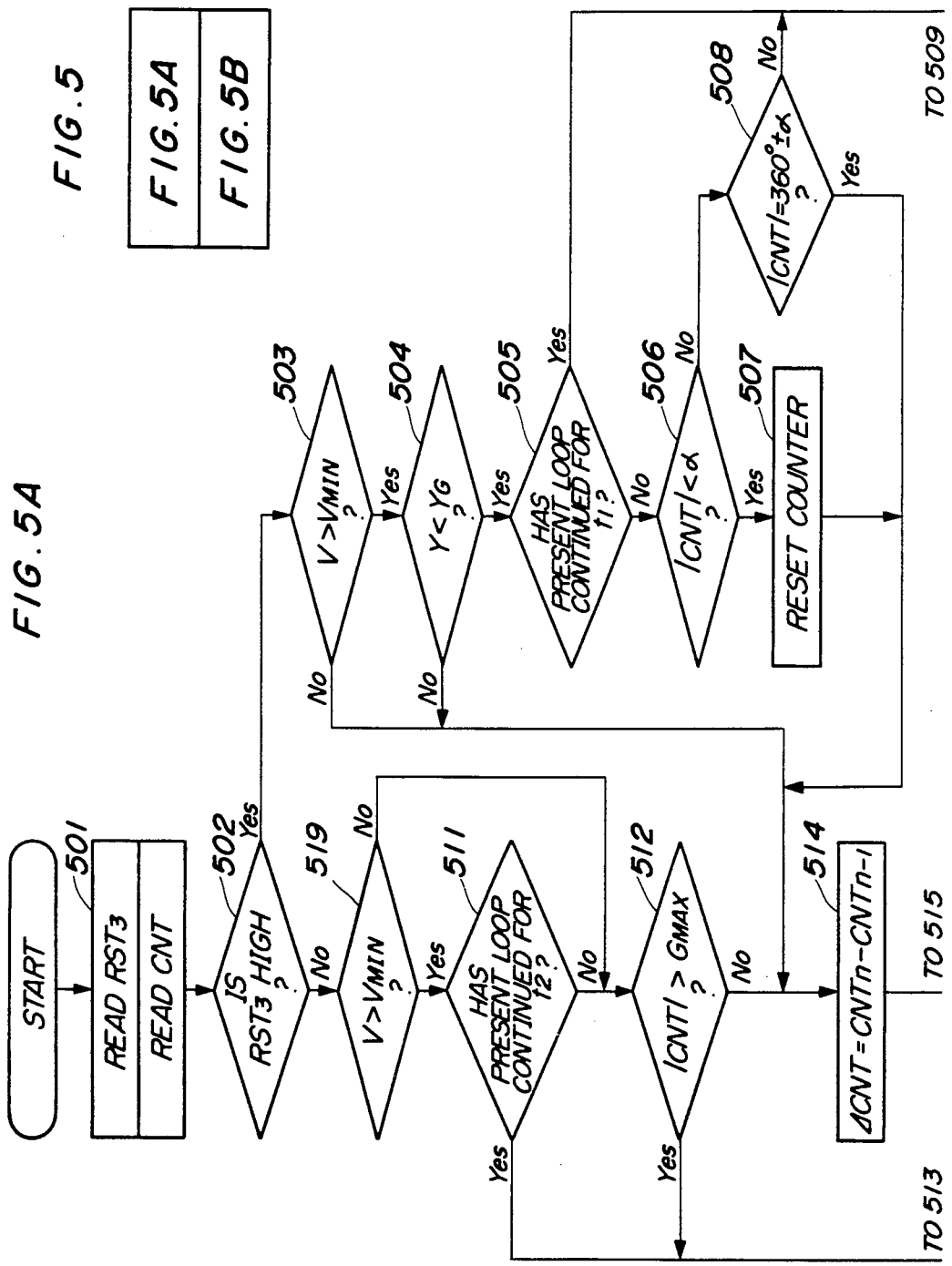

STEERING ANGLE DETECTING SYSTEM FOR AUTOMOTIVE VEHICLES

BACKGROUND OF THE INVENTION

The present invention relates to a steering angle detecting system for automotive vehicles, and more particularly to a steering angle detecting system which has improved reliability in detecting a steering angle.

Recently, some four-wheel automotive vehicles incorporate a control system for carrying out given control in response to the steering angle. Such a control system includes a steering angle detecting system which uses a steering angle sensor for detecting the steering angle.

The steering angle sensor of the steering angle detecting system is usually constructed such that a signal indicative of the steering angle is generated by means of pulses. For instance, the sensor comprises optical pulse-generating means, which generates optical signal pulses in accordance with rotation of a steering wheel when the driver operates the steering wheel, whereby information on the steering angle of the vehicle is obtained by means of a counter which counts signal pulses based on the optical signal pulses. The steering angle detecting system thus constructed using the steering angle sensor has the advantage that, since pulses are used as a processing signal in the sensor, the steering angle can be resolved to a desired high degree to thereby enhance precision in detecting the steering angle.

However, in the event that abnormality occurs in the pulse generating means or in the pulse processing section of the steering angle detecting system, it will be impossible to carry out proper control in response to the steering angle. Therefore, to detect abnormality in the steering angle detecting system is essential for prevention of malfunctioning of the control system due to the abnormality. In particular, if the steering angle detecting system is constructed such that the number of generated pulses indicates the steering amount, i.e. the steering angle through which the steering wheel has been rotated, abnormality, such as miscounting of signal pulses due to omission of signal pulses or superposition of noise on signal pulses, results in that the counter output indicates a steering amount different from the actual steering amount. Therefore, it is critically important to properly detect such an abnormality.

Further, an abnormality, which should result in a sudden change in the signal indicative of the steering angle, such as malfunctioning of the counter, suddenly affects the operation of the control system. Therefore, it is particularly important to promptly detect the abnormality.

SUMMARY OF THE INVENTION

It is an object of the invention to provide a steering angle detecting system which is capable of detecting abnormality thereof to thereby enhance reliability in detection of the steering angle.

It is a further object of the invention to provide a steering angle detecting system which is capable of detecting abnormality thereof which causes a sudden change in the output thereof indicating the steering angle to thereby enhance reliability in detection of the steering angle.

It is another object of the invention to provide a steering angle detecting system which is capable of detecting abnormality thereof accurately and promptly.

In order to attain the above objects, according to a first aspect of the invention, there is provided a steering angle detecting system for a vehicle having a steering member. The system has angular pulse generating means responsive to rotation of the steering member for generating angular pulses corresponding in number to a steering angle by which the steering member has been operated. A predetermined reference pulse is generated at a predetermined angle of the steering member by a reference pulse generating means. The angular pulses from the angular pulse generating means are counted by a counter which generates a counted value as data on the steering angle. An abnormality determining means connected with the reference pulse generating means and the counter determines that the steering angle detecting system is abnormal when the counted value generated by the counter is not within a predetermined value range when the predetermined reference pulse is generated.

Preferably, the steering angle detecting system includes vehicle speed signal generating means for generating a signal indicative of the speed of the vehicle; and inhibiting means for inhibiting the abnormality determining means from effecting determination of abnormality in the steering angle detecting system if the speed signal is not generated when the predetermined reference pulse is generated. The inhibiting means may preferably inhibit the determination of abnormality in the steering angle detecting system when the vehicle is running below a predetermined speed.

The steering angle detecting system may include yaw rate detecting means for detecting the yaw rate of the vehicle, and means for inhibiting the determination of abnormality in the steering angle detecting system when the vehicle is running above a predetermined speed and at the same time the yaw rate of the vehicle is smaller than a predetermined value.

According to a second aspect of the invention, there is provided a steering angle detecting system for a vehicle having a steering member. Angular pulse generating means responsive to rotation of the steering member generates angular pulses corresponding in number to the steering angle by which the steering member has been operated. A counter counts the angular pulses from the angular pulse generating means and generating a counted value as data on the steering angle. Steering angle variation detecting means detects a rate of change of the counted value generated by the counter. Abnormality determining means determines that the steering angle detecting system is abnormal when the rate of change of the counted value detected by the steering angle variation detecting means is higher than a predetermined value. The predetermined value of the rate of change of the counted value is preferably set at a value greater than the maximum possible value that can be assumed when the steering member is normally operated.

According to a third aspect of the invention, there is provided a steering angle detecting system for a vehicle having a steering member. Angular pulse generating means responsive to rotation of the steering member generates angular pulses corresponding in number to a steering angle by which the steering member has been operated. A counter counts the angular pulses from the angular pulse generating means and generates a counted value as data on the steering angle. Steering angle variation detecting means detects a rate of change of the counted value generated by the counter. Steering angle variation determining means determines whether or not the rate of change of the counted value detected by the steering angle variation detecting means is smaller than a predetermined value. Time counting means starts counting the time elapsed from the time the steering angle variation determining means determines for the first time that the rate of change of the counted value detected by the steering angle variation detecting means is smaller than the predetermined value. Abnormality determining means responsive to an output from the time counting means determines that the steering angle detecting system is abnormal when the rate of change of the counted value has continued to be smaller than the predetermined value for a predetermined time period or longer.

The predetermined value of the rate of change of the counted value is preferably set at a value smaller than the minimum possible value that can be assumed when the steering member is normally operated for the predetermined time period while the vehicle is running.

The steering angle detecting system preferably includes means for generating a signal indicative of the speed of the vehicle, and means for inhibiting the abnormality determining means from effecting determination of abnormality in the steering angle detecting system when the speed signal indicates a vehicle speed value lower than a predetermined value.

According to a fourth aspect of the invention, there is provided a steering angle detecting system for a vehicle having a steering member. Angular pulse generating means responsive to rotation of the steering member generates angular pulses corresponding in number to a steering angle by which the steering member has been rotated. Reference pulse generating means generates a predetermined reference pulse at a predetermined angle of the steering member. Abnormality determining means determines that the steering angle detecting system is abnormal when the predetermined reference pulse generated by the reference pulse generated means has continued to be in the same state for a predetermined time period.

According to a fifth aspect of the invention, there is provided a steering angle detecting system for a vehicle having a steering member. Angular pulse generating means responsive to rotation of the steering member generates angular pulses corresponding in number to a steering angle by which the steering member has been operated. Reference pulse generating means generates a predetermined reference pulse at a predetermined angle of the steering member. Abnormality determining means determines that the steering angle detecting system is abnormal when the predetermined reference pulse has not been generated for a predetermined time period.

The above and other objects, features and advantages of the present invention will be more apparent from the ensuing detailed description taken in conjunction with the accompanying drawings.

BRIEF DESCRIPTION OF THE INVENTION

DETAILED DESCRIPTION

An embodiment of the invention will be described in detail below with reference to the drawings.

Figure 1:
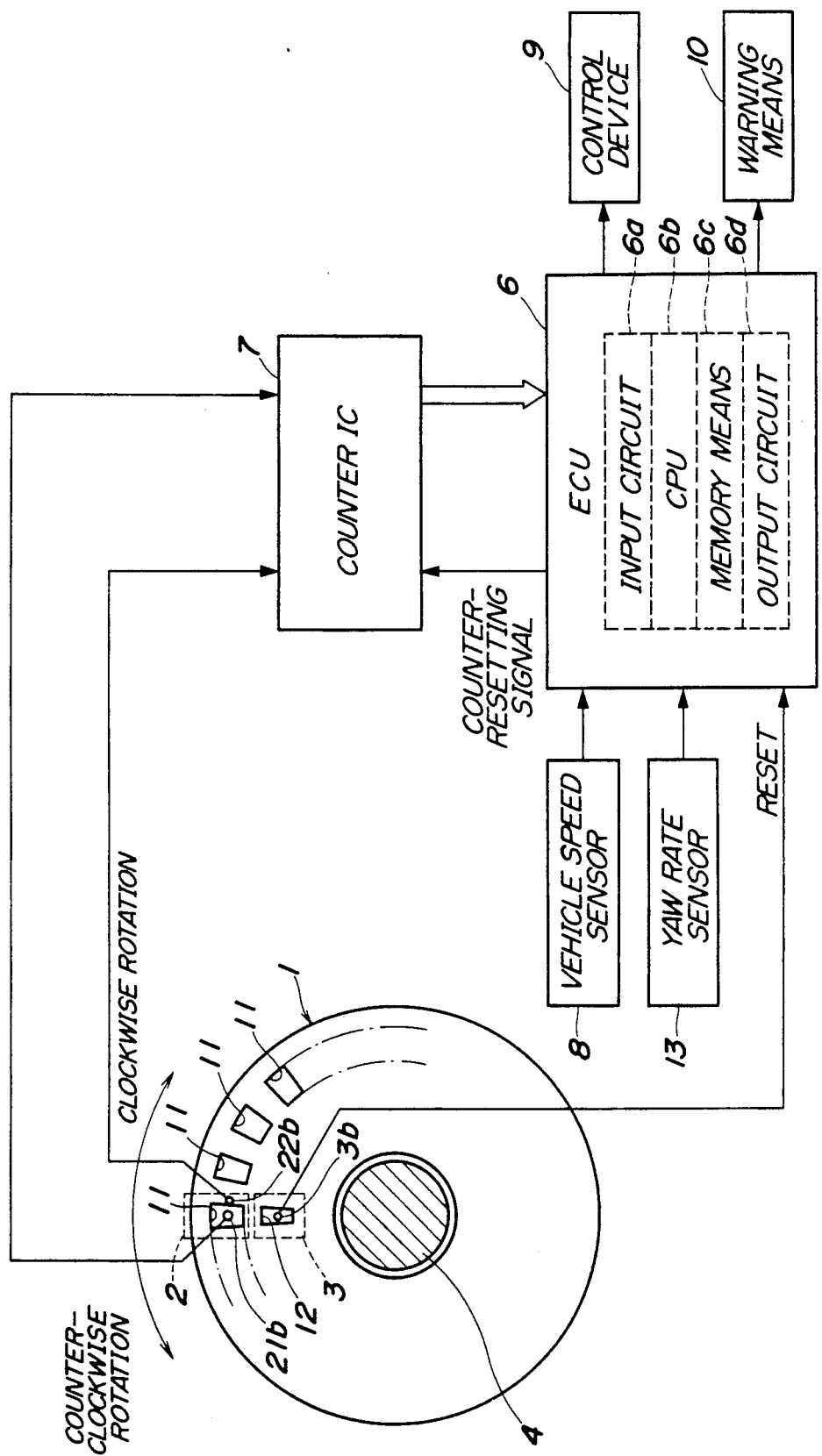
FIG. 1 is a schematic diagram showing the whole arrangement of a steering angle detecting system according to an embodiment of the invention.

Referring first to FIG. 1, there is shown the whole arrangement of a steering angle detecting system according to an embodiment of the invention.

In this embodiment, the system includes a steering angle sensor which is formed of an optical transmission type. The steering angle sensor comprises a moving member, which moves in accordance with rotation of a steering wheel (steering member), which is embodied by a rotating disc (sensor disc) 1 as shown in FIG. 1, photosensor means 2 for generating angular pulses for measuring the steering angle, and photosensor means 3 for generating a reference pulse.

Figure 4:
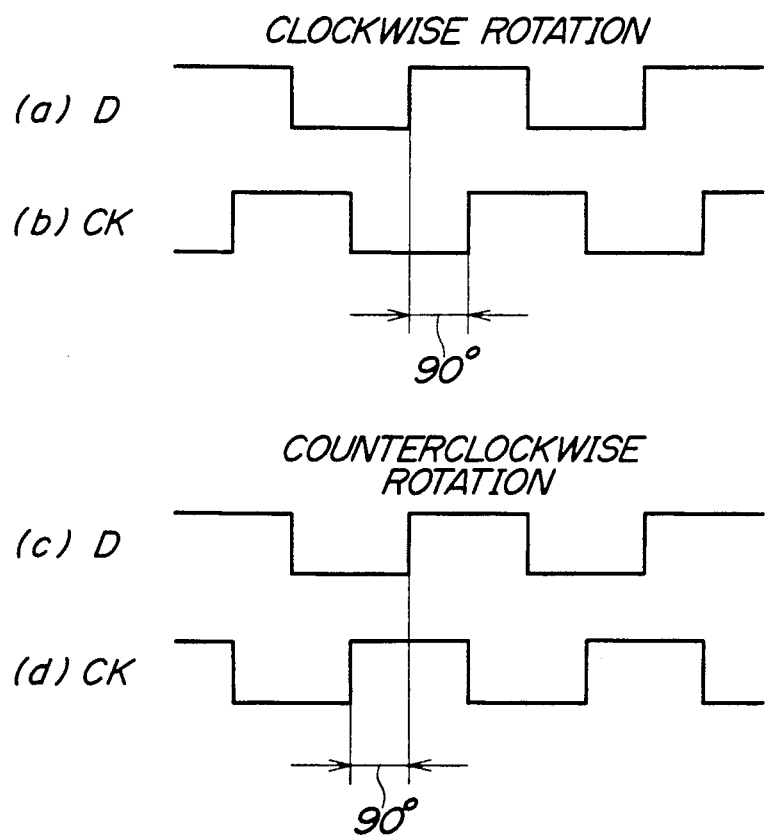
FIG. 4 is a timing charge of signal pulses useful in explaining the present invention.

The rotating disc 1 is mounted on a steering shaft 4 for rotation in unison therewith. The rotating disc 1 has a peripheral portion thereof formed therein with a plurality of slits 11 arranged at equal intervals along the entire circumference thereof. The width or circumferential size of the slits 11 and the distance between adjacent slits 11 are set such that the duty ratio (ON/OFF ratio) of signal pulses produced from the photosensor means 2 when the rotating disc 1 is rotated at a constant velocity is 50% (as shown in FIG. 4), for instance.

The photosensor means 2 is arranged at such a location as to face the row of slits 11, and comprises a pair of photosensors 21, 22. One photosensor 21 comprises a light-emitting element 21a and a light-receiving element 21b arranged in opposed relation to each other at opposite sides of the rotating disc 1. The other photosensor 22 also comprises a light-emitting element 22a and a light-receiving element 22b also opposed to each other, similarly to the elements 21a, 21b of the photosensor 21. These photosensors 21, 22 are so located relative to each other in the circumferential direction of the rotating disc 1 that there is a phase difference of 90° between two pulse signals which are generated from the respective photosensors when the rotating disc 1 is rotated at a constant velocity (see FIG. 4).

When the steering wheel is turned to the right or to the left from a reference operating position (neutral position) thereof to turn the vehicle to the right or to the left, pulses are generated whenever each slit passes the photosensors means 2 as the rotating disc 1 is rotated to the right (in the clockwise direction as viewed in FIG. 1) or to the left (in the counterclockwise direction as viewed in FIG. 1) in accordance with rotation of the steering shaft 4. Therefore, the number of pulses obtained from the photosensor means 2 corresponds to the amount of change in the direction of vehicle wheels, and the output from the photosensor means 2 contains information on the steering angle. Further, the output from the photosensor means 2 contains not only information on the rotational angle of the steering shaft 4, i.e.

the steering angle, but also information on the rate of change in the steering angle, or steering speed. In other words, the number of pulses generated per unit time indicates the angular velocity (velocity of rotation) of the steering shaft 4. Further, since a pair of photosensors 21, 22 are used as described above, the direction (clockwise or counterclockwise direction) of rotation of the steering shaft 4 can be detected by the use of phase difference between the pulses generated by the respective photosensors 21, 22. Therefore, the output from the photosensor means 2 also contains information of the direction of rotation of the steering shaft 4. The manner of detection of the direction of rotation will be described in detail hereinafter.

In this embodiment of the invention, the rotating disc 1 formed with the row of slits 11 and the photosensor means 2 cooperate to form means for generating angular pulses giving information on the steering angle in response to rotation of the steering shaft 4.

Figure 2:
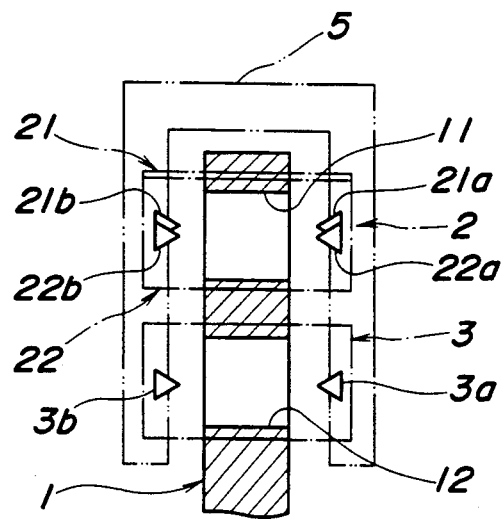
FIG. 2 is a schematic diagram showing an example of arrangement of a light-emitting element and a light-receiving element of photosensors appearing in FIG. 1.

The rotation disc 1 also has a single slit 12 formed therein at a location radially inward of the row of slits 11. The photosensor means 3 for generating the reference pulse referred to hereinabove comprises a single photosensor arranged at a predetermined location of the path of rotation of the slit 12. In the embodiment of FIG. 1, the photosensor means 3 is arranged adjacent and right below the photosensor means 2. The photosensor means 3 also comprises a light-emitting element 3a and a light-receiving element 3b opposed to each other at opposite sides of the rotating disc 1 as shown in FIG. 2.

The light-emitting elements 21a, 22a, 3a of the photosensor means 2 and the photosensor means 3 may each be formed by a light-emitting diode (LED), and the light-receiving elements 21b, 22b, 3b by a phototransistor, respectively. The light-emitting diodes and photosensors may be mounted on a housing having a U-shaped cross-section, which covers part of the rotating disc 1 as shown by the two-dot chain line in FIG. 2.

The rotating disc 1 is mounted on the steering shaft in such a manner that the rotational position of the steering shaft 4 assumed when the steering wheel is in the reference operating position (neutral position), i.e. when the vehicle is running straight forward, is a reference position (0°), in which the photosensor means 3 faces the single slit 12. By thus setting the rotation disc 1, when the steering shaft 4 is in the reference position (0°), light emitted from the light-emitting element 3a of the photosensor means 3 reaches the light-receiving element 3b thereof through the single slit 12 whereby the light-receiving element 3b generates a high level output. On the other hand, when the steering shaft 4 is rotates clockwise or counterclockwise from the reference position (0°), the output of the light-receiving element 3b is changed into a low level. Thus, the photosensor means 3 generates a signal pulse (signal $RST_3$) whenever the steering wheel is operated to cause the steering shaft 4 to pass the reference position (0°).

However, if lock-to-lock range, i.e. maximum rotatable range, of the steering wheel is more than one rotation (360°) as in the case of four-wheel vehicles, for instance, 2.5 rotations (900°), the maximum steering wheel-operating angle (corresponding to the lock angle of front wheels) on one side is 450°. Therefore, when the steering wheel is rotated clockwise or counterclockwise by an angle of 360° (one rotation) from the reference operating position, the single slit 12 also comes to a position in which it faces the photosensor means 3, similarly to the position shown in FIG. 1, whereby the photosensor means 3 also generates a high level output.

The light-receiving element 3b of the photosensor means 3 is electrically connected to an electronic control unit (hereinafter referred to as "the ECU") 6, to supply same with its output signal as a reset (RST) signal.

In this embodiment of the invention, the photosensor means 3 forms means for generating the reference pulse at a predetermined rotational angle of the steering shaft 4.

The steering angle detecting system further includes a counter IC 7. The photosensor means 2 for generating the angular pulses is electrically connected to the counter IC 7. The counter IC 7 receives angular pulses from the photosensor means 2 and converts them into data on the steering angle.

Figure 3:
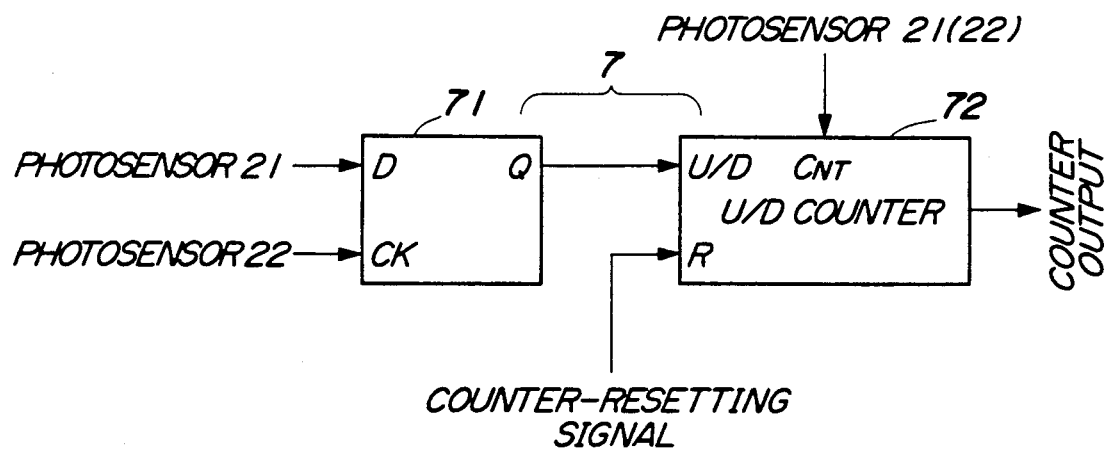
FIG. 3 is a block diagram showing an example of internal arrangement of a counter IC appearing of FIG. 1.

The counter IC 7 comprises a D-type flip-flop 71, and an up-down (U/D) counter 72 as shown in FIG. 3. In FIG. 3, the D-type flip-flop 71 includes a data input terminal D connected to the output of the photosensor 21, and a clock pulse input terminal CK connected to the output of the photosensor 22. Thus, the output from the photosensor 21 is supplied to the data input terminal D, and the output from the photosensor 22 is supplied to the clock pulse input terminal CK. The up-down counter 72 has an up-down changeover terminal U/D which is electrically connected to an output terminal Q of the D-type flip-flop 71.

The two pulse trains generated from the respective photosensors 21, 22 have a phase difference between them, as started before. Therefore, as shown in FIG. 4, the phaseal relationship between the two pulse trains is inverted between when the steering wheel is turned clockwise ((a), (b) of FIG. 4), and when the steering wheel is turned counterclockwise ((c), (d) of same). Specifically, when the steering wheel is turned clockwise, pulses generated from the photosensor 22 are delayed in phase from pulses generated from the photosensor 21. In other words, the input level to the input terminal D from the photosensor 21 is high at the time of rising of each input clock pulse. Therefore, on this occasion, when a clock pulse from the photosensor 22 is applied to the input terminal CK, a high output is produced at the output terminal Q, which is at the same level as the input to the input terminal D from the photosensor 21. So long as the phaseal relationship in (a), (b) of FIG. 4 holds, that is, while the steering wheel is being turned clockwise, the high putput continues to be produced at the output terminal Q.

On the other hand, when the steering wheel is turned counterclockwise, the phaseal relationship is inverted, so that the phase of pulses from the photosensor 22 is advanced compared with that of pulses from the photosensor 21. Therefore, since the input to the data input terminal D at the time of rising of each input clock pulse continues to be at low level, a low level output continues to be produced from the output terminal Q. Thus, by determining whether a high level output or a low level output is produced from the output terminal Q of the D-type flip-flop 71, the direction (clockwise or counterclockwise) of rotation of the steering wheel can be detected. The output from the output terminal Q is supplied to the up-down counter 72 as a control signal for changeover between up-counting and down-counting.

One of the photosensors 21, 22 is electrically connected to a counting pulse input terminal $C_{NT}$ of the up-down counter 72 to apply an output thereof to the terminal. A pulse train from the one photosensor 21 or 22 may be supplied to the terminal $C_{NT}$ directly or after multiplying (e.g. doubling) the frequency of the pulse train by means of a multiplying device formed of a suitable logic circuit. The up-down counter 72 up-counts or down-counts the number of pulses supplied to the terminal $C_{NT}$ depending on the output of the output terminal Q of the D-type flip-flop 71, and outputs the counted value. The output from the up-down counter 72 contains information on the steering angle which varies as the steering wheel is turned by the driver, as well as on the direction of rotation of the steering wheel.

Specifically, supposing that the up-down counter 72 carries out up-counting when the output of the output terminal Q is at high level, and down-counting when the output thereof is at a low level, the counted value increases when the steering wheel is turned clockwise, and decreases when the steering wheel is turned counterclockwise. Therefore, if the rotational angle of the steering wheel or the steering shaft 4 is arranged to correspond to the contents of the up-down counter 72 in such a manner that the up-down counter outputs a value of 0 when the steering shaft 4 is in the reference position (0°), the counted value increases as the steering wheel is turned clockwise by the amount corresponding to the degree of rotation of the steering shaft from the reference position (0°), and further increases as the steering wheel is further turned clockwise by the amount corresponding to a further rotation of the steering wheel. On the other hand, if the steering wheel starts to be turned counterclockwise, the input to the D-type flip-flop 71 is changed into the state shown by (c) and (d) of FIG. 4. With the input to the D-type flip-flop 71 in this state, the output from the output terminal Q of the flip-flop 71 is at low level so that the up-down counter 72 starts down-counting and the counted vale returns to 0 when the steering shaft 4 is turned counterclockwise by the amount corresponding to the clockwise rotation of the steering shaft 4 previously carried out from the reference position thereof.

The counter IC 7 supplies the information on the steering angle and the rotating direction thus obtained based on the angular pulses to the ECU 6.

Further connected to the ECU 6 are a vehicle speed sensor 8 for supplying a single indicative of the speed of the vehicle thereto, and a yaw rate sensor 13 for supplying a signal indicative of the yaw rate of the vehicle thereto.

The ECU 6 comprises an input circuit 6a having functions of shaping the waveforms of input signals from various sensors, shifting the voltage levels of output signals from analog output sensors to a predetermined level, and so forth, a central processing unit (hereinafter referred to as "the CPU") 6b, memory means 6c storing various operational programs which are executed in the CPU 6b including a program for determining abnormality in the steering angle detecting system, described in detail hereinbelow, and for storing results of calculations therefrom, etc., and an output circuit 6d. Connected to the ECU 6 is a device 9 to be controlled by the CPU 6b, which operates in response to the output from the steering angle detecting system. The steering angle detecting system according to the invention can be applied to any various control systems of an automotive vehicle which requires information on the steering angle for its control operation. For instance, the control device 9 may be an actuator for changing the damping factor of a vehicle suspension in response to the steering angle, or may be a control device used for four-wheel steering control.

The control device 9 is supplied with a control signal from the CPU 6b by way of the output circuit 6d.

Further connected to the ECU 6 is warning means 10 which, for instance, performs indication of abnormality by means of an LED or the like as one of fail-safe functions in the event of abnormality in the steering angle detecting system when it is detected. When abnormality is detected by the above abnormality determining program, a control signal indicative of occurrence of the abnormality is supplied through the output circuit 6d to the warning means 10. Further, the counter IC is connected to the ECU 6 to be reset thereby. Specifically, a counter-resetting signal is supplied to a reset terminal R of the up-down counter 72 by way of the output circuit 6d.

Figure 5B:
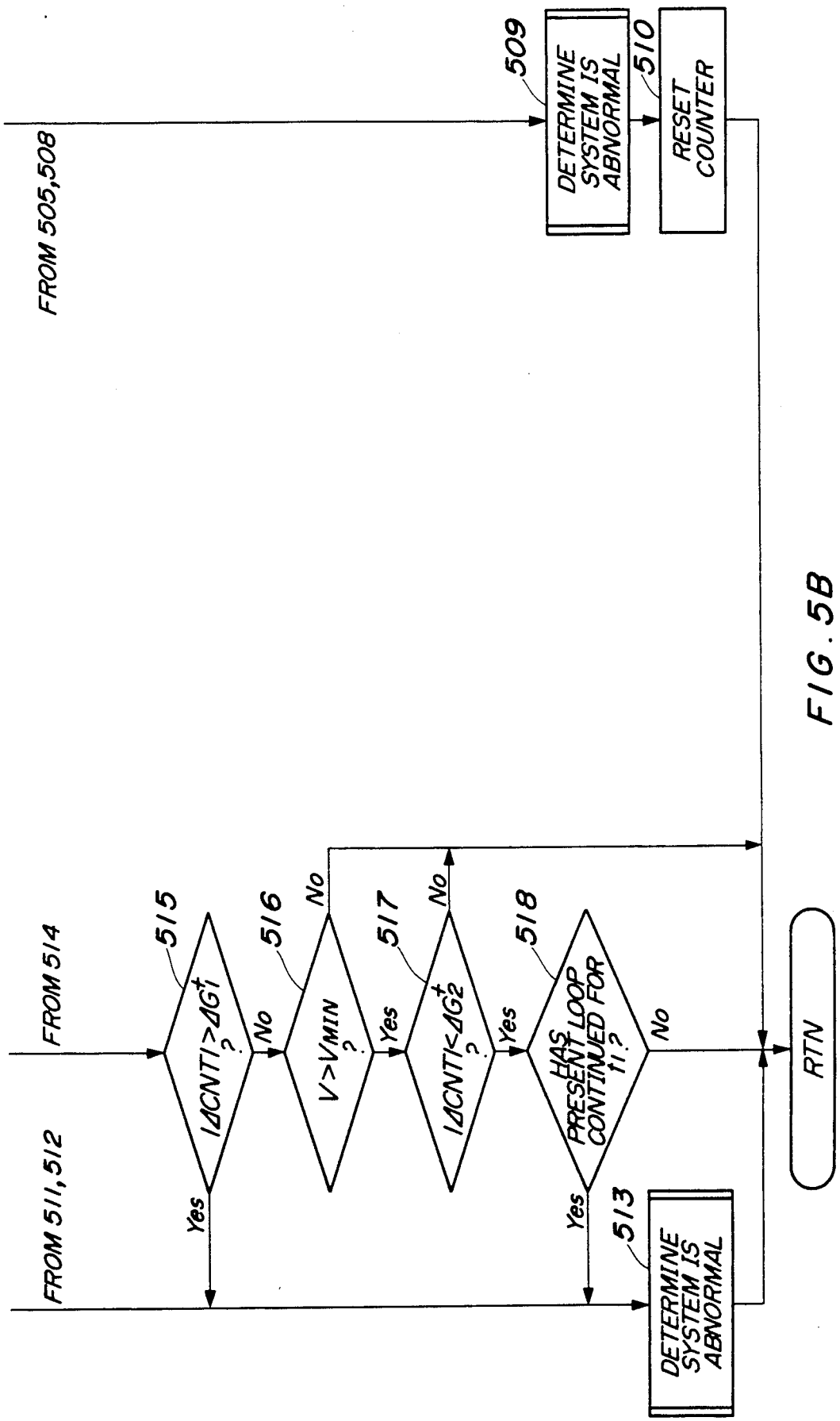
FIG. 5 (comprising FIGS. 5A and 5B) is a flowchart of an example of a program for determining abnormality of the steering angle detecting system according to the invention.

FIG. 5 shows a flowchart of the abnormality determining program for the steering angle detecting system which is executed by the CPU. This subroutine is carried out in synchronism with generation of each TDC signal pulse (a pulse generated at one of predetermined crank angles each time the engine crank shaft rotates through 180°), or a predetermined constant time intervals.

First, at a step 501, whenever the present program is executed, a signal $RST_3$ from the photosensor means 3 as reference pulses and a counted value CNT from the up-down counter 72 indicative of the steering angle are read, and it is determined at a step 502 whether or not the signal $RST_3$ is at high level. If the answer to the question of the step 502 is Yes, i.e. if the signal $RST_3$ is at high level, the program proceeds to steps 503 et seq. for the following reason:

The signal $RST_3$ is at high level, when the steering wheel-operating angle is 0° or 360°, i.e. when the single slit 12 faces the photosensor means 3 with the steering shaft being in the reference position (0°) as shown in FIG. 1, or when the single slit 12 faces the photosensor means 3 with the steering shaft having been rotated clockwise or counterclockwise by 360°. In other words, the state of the signal $RST_3$ being at high level may imply that the vehicle is running straight forwarned, or that the steering wheel has been turned clockwise or counterclockwise just by 360°. Therefore, if the answer to the question of the step 502 is Yes, it is first determined at a step 503 whether or not the speed V of the vehicle is higher than a predetermined value $V_{MIN}$ (e.g. 5 km/h). If the answer to the question of the step 503 is No, i.e. if the vehicle speed V is equal to or lower than the predetermined value $V_{MIN}$, steps 514 et seq., referred to hereinafter, are executed.

If the answer to the question of the step 503 is Yes, i.e. if $V > V_{MIN}$, the following determinations are carried out. At a step 504, it is determined whether or not a detected value Y of the yaw rate is smaller than a predetermined value YG (3 degrees/sec.), i.e. whether or not the vehicle is running almost straight forward. The yaw rate is sensed by the yaw rate sensor 13 which may be a gyroscope or may be adapted to detect the difference between the rotational speeds of right and left railing wheels.

If the answer to the question of the step 504 is No, the program proceeds to the steps 514 et seq., whereas if the answer is Yes, it is determined at a step 505 whether or not the present loop has been continually repeatedly executed for a predetermined time period $t_1$ (e.g. 120 seconds), that is, the answer to the question of the step 504 has been continually affirmative or Yes for the time period $t_1$. If the answer to the question of the step 505 is No, the program proceeds to steps 506 et seq.

In other words, if the predetermined time period $t_1$ has not elapsed since the signal $RST_3$ was changed into high level under the condition of the speed V of the vehicle being higher than the predetermined value $V_{MIN}$, the following steps are executed.

First at a step 506, it is determined whether or not the absolute $|CNT|$ of the output of the updown counter 72 is smaller than a predetermined value $\alpha$ (e.g. 2°).

If the answer to the question of the step 506 is Yes, i.e. if $|CNT| < \alpha$ under the condition of the $RST_3$ signal being at high level, the steering shaft 4 is in the reference position (60°) in which the single slit 12 faces the photosensor means 3. Therefore, in this case, the counter-resetting signal is supplied to the up-down counter 72 at a step 507, and then the steps 514 et seq. are executed. Thus, the counter 72 is cleared when the steering shaft is in the reference position (0°) to thereby cause the counter 72 to generated at output of 0. The predetermined value $\alpha$ which is applied at the step 506 is for providing a tolerance in carrying out the above determination.

If the answer to the question of the step 506 is No, i.e. if the absolute value $|CNT|$ excess the predetermined value $\alpha$, it is determined at a step 508 whether or not the absolute value $|CNT|$ is not smaller than $360° - \alpha$ and not greater than $360° + \alpha$. If the answer to the question of the step 508 is Yes, i.e. if the absolute value $|CNT|$ is within the range of $360° \pm \alpha$, this means that the single slit 12 faces the photosensor means 3 after the steering shaft 4 has been clockwise or counterclockwise rotated by 360° to cause the signal $RST_3$ to go high. In other words, if the steering angle detecting system is normally functioning, as the steering wheel is turned clockwise or counterclockwise by one rotation (360°), up counting or down-counting of the angular pulses inputted is carried out to produce a counted value indicative of 360°. Therefore, if a pulse is obtained from the photosensor means 3 under the condition of $|CNT| = 360° \pm \alpha$, it is considered that normal counting operation has been carried out. In this case, therefore, resetting of the counter 72 is not carried out, and the program proceeds to steps 514 et seq. with the counted value CNT on this occasion being held.

On the other hand, if the answer to the question of the step 508 is No, i.e. a high level signal has been produced as the signal $RST_3$ in spite of the fact that neither $|CNT| < \alpha$ nor $|CNT| = 360° \pm \alpha$, it is determined at a step 509 that the counted value CNT has been made abnormal due to noise or the like, and then the resetting signal is supplied to the up-down counter 72 at a step 510, followed by terminating the present program. Thus, abnormality in the steering angle detecting system can be positively detected by determining whether or not the absolute value of CNT indicative of the steering angle shows a value other than 0° or 360° when the reference pulse has been generated. Thus, abnormality in the steering angle detecting system due to miscounting of pulses caused by omission of counting pulses or by superposition of noise on the pulses can be detected with high reliability.

Fail-safe functions in the event of occurrence of abnormality in the steering angle detecting system determined at the step 509 may include warning by the warning means 10, such as lighting-up of the LED, whereby the driver can notice the occurrence of abnormality in the steering angle detecting system. The resetting of the up-down counter 72 forcedly carried out upon occurrence of the abnormality is for presenting a signal indicative of the steering angle from being produced when the steering angle detecting system is abnormal, to thereby make ineffective the function of the up-down counter 72 (i.e. the function of obtaining information on the steering angle based on the angular pulses inputted), and hold the output thereof at 0. This fail-safe operation of the steering angle detecting system makes it possible to prevent a control system connected thereto from operating according to an erroneous steering angle signal.

In the meanwhile, if the answer to the question of the step 505 is Yes, i.e. if a high level signal has continued to be produced for the predetermined time period $t_1$ or longer as the signal $RST_3$, which means that the signal $RST_3$ has not changed into a low level even once for the predetermined time period $t_1$ or longer, with the speed V of the vehicle being higher than a predetermined value $V_{MIN}$ (e.g. 5 km/h), the program proceeds to the steps 509 and 510, followed by terminating the present program. The affirmative (Yes) answer to the question of the step 505 means that the position of the steering wheel has not shifted from the reference operating position (neutral position) or the position assumed by the steering wheel after rotation through 360° for as long a time period as t1 while the vehicle is running, provided that the steering angle detecting system is normally functioning. In actuality, when the vehicle is running at a certain speed or higher, the state cannot be continued for such a long time period at $t_1$ in which the position of the steering wheel is not changed at all. Therefore, under the above conditions, it can be presumed that there is something wrong with the steering angle detecting system, which impedes normal functioning of the system, and therefore, upon elapse of the predetermined time period $t_1$, it is determined that the steering angle detecting system is abnormal.

Referring again to the step 502, if the answer to the question thereof is No, i.e. if the signal $RST_3$ is at low level, it is determined at a step 511 whether or not the present loop has been continually repeatedly carried out for a predetermined time period $t_2$ (e.g. 360 seconds) or longer, that is, the answer to the question of the step 502 has been continually negative or No for the time period $t_2$, and at a step 512 whether or not the absolute value $|CNT|$ of the counted value CNT is greater than a predetermined value $G_{MAX}$. The predetermined value $G_{MAX}$ is set in accordance with the lock angle of the steering wheel of the vehicle. For instance, if the lock-to-lock range of the rotational angle of the steering wheel is 2.5 rotations (900°), the predetermined value $G_{MAX}$ is set at 450°.

If both of the answers to the questions of the steps 511 and 512 are No, the program proceeds to a step 514, whereas if one of the answers is Yes, it is determined at a step 513 that the steering angle detecting system is abnormal, followed by terminating the present program.

The step 511 is provided in view of the fact that if the vehicle is running at a certain speed or higher, normally, the reset signal at high level must be generated as the output of the photosensor means 3 within the predetermined time period $t_2$. If the signal $RST_3$ continues to be at low level for the predetermined time period $t_2$ or longer, it is determined from the above viewpoint that the steering angle detecting system is abnormal.

If the answer to the question of the step 512 is Yes, this means that the output of the up-down counter 72 indicates a value which is greater than the maximum actually possible range of the rotational angle of the steering wheel. Therefore, in this case as well, it is judged that the steering angle detecting system cannot perform normal detection of the steering angle due to some cause, such as influence of noise of the counted value CNT, and therefore that the steering angle detecting system is abnormal.

At the step 514, a variation $\Delta CNT$ in the counted value CNT (the difference between $CNT_{n-1}$ of the immediately preceding loop and $CNT_n$ of the present loop) is calculated, and it is determined at a step 515 whether or not the absolute value $|\Delta CNT|$ of the $\Delta CNT$ is greater than a first predetermined value $\Delta G_1^+$ for determining the variation of the steering angle (e.g. 500°/sec.×1.5, preferably, 700°/sec.). The first predetermined value $\Delta G_1^+$ is set at a value greater than the maximum possible value that can be assumed when the steering wheel is normally operated. If the answer to the question of the step 515 is Yes, i.e. if $|\Delta CNT| > \Delta G_1^+$, which means that the value of the rate of change of the steering angle is by far greater than values assumed when the steering wheel is normally operated, it is determined at a step 513 that the steering angle detecting system is abnormal. More specifically, the fact that $|\Delta CNT|$ exceeds $\Delta G_1^+$ implies that the rotational angle of the steering wheel has changed instantly from a value assumed at the time the counted value CNT was read in the immediately preceding loop to a value which is considerably different from the former value. However, this cannot be the case when the steering wheel is normally operated by the driver, and means that there is a strong likelihood of occurrence of abnormality, such as malfunctioning of the counter IC 7. Therefore, it is determined that the steering angle detecting system is abnormal, if the counted value variation exceeds the predetermined value $\Delta G_1^+$.

Thus, by monitoring the variation of the counted value CNT generated from the counter 7, it is possible to promptly detect such an abnormality in the steering angle detecting system as results in a violent change of the signal indicative of the steering angle, whereby the reliability in detection of the steering angle is improved.

The fail-safe functions to be performed upon occurrence of abnormality of the steering angle detecting system determined at the step 513 may include visual indication of the abnormality etc., similarly to the case where the abnormality is detected when the counted value CNT does not indicate the predetermined values when a reference pulse is generated.

If the answer to the question of the step 515 is No, i.e. if $|\Delta CNT|$ does not exceed $\Delta G_1^+$, it is judge that there is no such abnormality as described above, and the program proceeds to steps 516 et seq. It is determined at a step 516 whether or not the vehicle speed V is higher than the predetermined value $V_{MIN}$, and at a step 517 whether or not the absolute value $|\Delta CNT|$ of the variation $\Delta CNT$ obtained at the step 514 is smaller than a second predetermined value $\Delta G_2^+$ (e.g. 3°/sec.). This second predetermined value $\Delta G_2^+$ is set at a value smaller than the minimum possible value that can be assumed when the steering wheel is normally operated for the predetermined time period $t_1$ while the vehicle is running.

If the answer to the question of the step 516 is No, i.e. if the vehicle speed V is not higher than the predetermined value $V_{MIN}$, or if the answer to the question of the step 517 is No, i.e. if $|\Delta CNT| \geq \Delta G_2^+$, the present program is immediately terminated. On the other hand, if both the answers to the questions of the steps 516 and 517 are Yes, i.e. if $V > V_{MIN}$ and $|\Delta CNT| < \Delta G_2^+$, it is determined at a step 518 whether or not the present loop has been continually repeated for the predetermined time period $t_1$ or longer. The monitoring of time elapsed from the point of time of satisfaction of the above two conditions at the step 518 is carried out, for instance, by the use of a time provided inside the CPU 6b.

If the answer to the question of the step 518 is No, i.e. if the predetermined time period $t_1$ has not yet elapsed since the start of the monitoring of elapsed time, the present program is terminated, considering that the steering angle detecting system is normal. If the answer is Yes, i.e. the state in which the absolute value of the variation of the steering angle is less than $\Delta G_2^+$ has continued for the predetermined time period $t_1$ or longer under the condition of the vehicle speed V being higher than the predetermined value $V_{MIN}$, it is determined at a step 513 that the steering angle detecting system is abnormal.

At the aforesaid step 515, when the variation of the steering angle is extremely great, it is immediately determined that the steering angle detecting system is abnormal since such a great variation cannot be obtained in normal operation of the steering wheel. In contrast, at the steps 516 to 518, the extremely small variation of the steering angle is used for determining abnormality of the steering angle detecting system. More specifically, the fact that $|\Delta CNT| < \Delta G_2^+$ implies that the rotational angle of the steering wheel has been hardly changed between the immediately preceding loop and the present loop. Such a state of the vehicle can continue for a short time period. For instance, when the vehicle is running straight forward, the driver will try to hold the steering wheel in the neutral position in order to maintain the straight forward running of the vehicle, and therefore, it is possible that the absolute value $|\Delta CNT|$ of the counted value CNT is smaller than $\Delta G_2^+$ even when the vehicle is running.

However, normally, it is impossible for the state of $|\Delta CNT| < \Delta G_2^+$ to continue for a long time period. For instance, even during straight forward running of the vehicle, the operation of alternately turning the steering wheel clockwise and counterclockwise is repeatedly carried out. Specifically, if the vehicle slightly turns to the right, the steering wheel is turned counterclockwise to restore the direction of the vehicle, and then such an operation is repeatedly carried out. Therefore, while the vehicle is normally operated, $|\Delta CNT|$ must become equal to or greater than $\Delta G_2^+$ (i.e. the answer to the question of the step 517 must become No) before the predetermined time period $t_1$ elapses. Therefore, if the state of $|\Delta CNT| < \Delta G_2^+$ has continued for the predetermined time period $t_1$ or longer, there is a strong likelihood of occurrence of abnormality in the steering angle detecting system, particularly in a data-processing system including the counter IC 7.

Therefore, under the above conditions of $V > V_{MIN}$ and $|\Delta CNT| < \Delta G_2^+$, abnormality in the steering angle detecting system is determined depending on lapse of the predetermined time period $t_1$, and it is determined that the system is abnormal when the predetermined time period $t_1$ has elapsed under the conditions.

The abnormality detection executed at the steps 516 to 518 is basically similar to that executed at the aforesaid steps 502 to 505. However, since the variation of the counted value CNT based on angular pulses is checked in the former steps, abnormality of the counter can be effectively detected in particular.

Thus, the steps 516 to 518 are effective to detect abnormality in the steering angle detecting system, particularly that in the counter. Further, since it is determined that the steering angle detecting system is abnormal on the condition that the state in which the absolute value of the variation of the counted value is smaller than the predetermined value continues for the predetermined time period or longer, it is possible to prevent erroneous detection of abnormality when the steering angle detecting system is normal, and at the same time to detect abnormality as promptly as possible, whereby the reliability in detection of the steering angle is improved.

Furthermore, although in the embodiment described above, the steering angle sensor is formed by an optical transmission type, this is not limitative, but an optical reflection type may be employed in place of the optical transmission type. Further, the sensor itself need not be an optical type.

Besides, although the moving member of the sensor is formed by the rotating disc 1, this is also not limitative, but there may be employed a linearly movable member.

Further, although the embodiment described above includes various manners of abnormality detection as shown in FIG. 5, only one of the abnormality detection manners may be employed, or part of all of the abnormality detection manners may be carried out in combination with another abnormality detection manner.

What is claimed is:

1. A steering angle detecting system for a vehicle having a steering member, comprising:
    angular pulse generating means responsive to rotation of said steering member for generating angular pulses corresponding in number to a steering angle by which said steering member has been operated;
    reference pulse generating means for generating a predetermined reference pulse at a predetermined angle of said steering member;
    a counter for counting said angular pulses from said angular pulse generating means and generating a counted value output representing said steering angle; and
    abnormality determining means connected with said reference pulse generating means and said counter output for determining that said steering angle detecting system is abnormal when the counted value generated by said counter is not within a predetermined value range when said predetermined reference pulse is generated.

2. A steering angle detecting system as claimed in claim 1, including vehicle speed signal generating means for generating a signal indicative of speed of said vehicle, yaw rate detecting means for detecting a yaw rate at which said vehicle is running, and inhibiting means for inhibiting said abnormality determining means from effecting determination of abnormality in said steering angle detecting system if at least one of the following conditions (i) and (ii) is satisfied: (i) said signal indicative of speed of said vehicle indicates a vehicle speed value lower than a predetermined vehicle speed value, and (ii) the yaw rate of said vehicle detected by said yaw rate detecting means is larger than a predetermined value.

3. A steering angle detecting system as claimed in claim 1, including vehicle speed signal generating means for generating a signal indicative of speed of said vehicle when said vehicle is running, and inhibiting means for inhibiting said abnormality determining means from effecting determination of abnormality in said steering angle detecting system if said signal indicative of speed of said vehicle is not generated from said vehicle speed signal generating means when said predetermined reference pulse is generated from said reference pulse generating means.

4. A steering angle detecting system as claimed in claim 3, wherein said inhibiting means inhibits the determination of abnormality in said steering angle detecting system if said signal indicative of speed of said vehicle indicates a vehicle speed value lower than a predetermined vehicle speed value.

5. A steering angle detecting system for a vehicle having a steering member, comprising:
    angular pulse generating means responsive to rotation of said steering member for generating angular pulses corresponding in number to a steering angle by which said steering member has been operated;
    a counter for counting said angular pulses from said angular pulse generating means and generating a counted value output representing said steering angle;
    steering angle variation detecting means for detecting a rate of change of the counted value output generated by said counter; and
    abnormality determining means for determining that said steering angle detecting system is abnormal when the rate of change of the counted value detected by said steering angle variation detecting system is higher than a predetermined value.

6. A steering angle detecting system as claimed in claim 5, wherein said predetermined value of the rate of change of the counted value is set at a value greater than the maximum possible value that can be assumed when said steering member is normally operated.

7. A steering angle detecting system for a vehicle having a steering member, comprising:
    angular pulse generating means responsive to rotation of said steering member for generating angular pulses corresponding in number to a steering angle by which said steering member has been operated;
    a counter for counting said angular pulses from said angular pulse generating means and generating a counted value output representing said steering angle;
    steering angle variation detecting means for detecting a rate of change of the counted value output generated by said counter;
    steering angle variation determining means for determining whether or not the rate of change of the counted value detected by said steering angle variation detecting means is smaller than a predetermined value;
    time counting means for starting counting of time elapsed from the time said steering angle variation determining means determines for the first time that the rate of change of the counted value detected by said steering angle variation detecting means is smaller than said predetermined value; and abnormality determining means for determining to an output from said time counting means for determining that said steering angle detecting system is abnormal when the rate of change of the counted value has continued to be smaller than said predetermined value for a least a predetermined time period.

8. A steering angle detecting system as claimed in claim 7, wherein said predetermined value of the rate of change of the counted value is set at a value smaller than the minimum possible value that can be assumed when said steering member is normally operated for said predetermined time period while said value is running.

9. A steering angle detecting system as claimed in claims 7 or 8, including vehicle speed signal generating means for generating a signal indicative of speed of said vehicle, and inhibiting means for inhibiting said abnormality determining means from effecting determination of abnormality in said steering angle detecting system when said signal indicative of speed of said vehicle generated by said vehicle speed signal generating means indicates a vehicle speed value lower than a predetermined vehicle speed value.

10. A steering angle detecting system for a vehicle having a steering member, comprising:
    angular pulse generating means responsive to rotation of said steering member for generating angular pulses corresponding in number to a steering angle by which said steering member has been rotated;
    reference pulse generating means for generating a predetermined reference pulse at a predetermined angle of said steering member; and
    abnormality determining means for determining that said steering angle detecting system is abnormal when said predetermined reference pulse generated by said reference pulse generating means has continued to be in the same state for a predetermined time period.

11. A steering angle detecting system as claimed in claim 10, including vehicle speed signal generating means for generating a signal indicative of speed of said vehicle when said vehicle is running, and inhibiting means for inhibiting said abnormality determining means from effecting determination of abnormality in said steering angle detecting system if said signal indicative of speed of said vehicle is not generated from said vehicle speed signal generating means when said predetermined reference pulse is generated from said reference pulse generating means.

12. A steering angle detecting system as claimed in claim 10, including vehicle speed signal generating means for generating a signal indicative of speed of said vehicle, yaw rate detecting means for detecting a yaw rate at which said vehicle is running, and inhibiting means for inhibiting said abnormality determining means from effecting determination of abnormality in said steering angle detecting system if at least one of the following conditions (i) and (ii) is satisfied: (i) said signal indicative of speed of said vehicle indicates a vehicle speed value lower than a predetermined vehicle speed value, and (ii) the yaw rate of said vehicle detected by said yaw rate detecting means is larger than a predetermined value.

* * * * *